United States Patent [19]
Bandyopadhyay et al.

[11] Patent Number: 5,854,515
[45] Date of Patent: Dec. 29, 1998

[54] INTEGRATED CIRCUIT HAVING CONDUCTORS OF ENHANCED CROSS-SECTIONAL AREA

[75] Inventors: Basab Bandyopadhyay; H. Jim Fulford, Jr.; Robert Dawson; Fred N. Hause; Mark W. Michael; William S. Brennan, all of Austin, Tex.

[73] Assignee: Advanced Micro Devices, Inc.

[21] Appl. No.: 685,143

[22] Filed: Jul. 23, 1996

[51] Int. Cl.⁶ .................................................. H01L 23/52
[52] U.S. Cl. .................... 257/775; 257/773; 257/920; 257/923; 257/748; 257/763; 257/765
[58] Field of Search ..................... 437/195, 203, 437/235, 228, 238, 245; 257/748, 750, 758, 763, 765, 768, 773, 775, 776, 920, 923

[56] References Cited

U.S. PATENT DOCUMENTS

| | | |
|---|---|---|
| 4,905,068 | 2/1990 | Satoh et al. . |
| 5,385,867 | 1/1995 | Ueda et al. . |
| 5,571,751 | 11/1996 | Chung ..................................... 437/187 |
| 5,602,050 | 2/1997 | Sudo . |

FOREIGN PATENT DOCUMENTS 63-244858  10/1988  Japan .

OTHER PUBLICATIONS

K. Ueno, et al. "Quarter Micron Planarized Interconnection Tech. With Self–Algned Plug" IEDM (Dec. 1992) pp. 305–308.

*Primary Examiner*—Caridad Everhart
*Attorney, Agent, or Firm*—Kevin L. Daffer; Conley, Rose & Tayon

[57] ABSTRACT

A interconnect structure is provided having a conductor with enhanced thickness. The conductor includes an upper portion and a lower portion, wherein the lower portion geometry is sufficient to increase the current-carrying capacity beyond that provided by the upper portion. The lower portion is formed by filling a trench within an upper dielectric region, and the upper portion is formed by selectively removing a conductive material from the upper dielectric surface except for regions directly above the lower portion. The upper and lower portions thereby form a conductor of enhanced cross-section which can be produced by modifying a via-etch mask, rather than having to reconfigure and/or move interconnect features formed by a metal mask.

12 Claims, 4 Drawing Sheets

INTEGRATED CIRCUIT HAVING CONDUCTORS OF ENHANCED CROSS-SECTIONAL AREA

BACKGROUND OF THE INVENTION

1. Field of the Invention

This invention relates to semiconductor fabrication and more particularly to an integrated circuit which employs a multilevel interconnect structure having thickened conductors in regions of dense interconnect. The thickened conductors of enhanced cross-sectional area have potential for carrying larger amounts of current commensurate with wide conductors. However, minimum spacing requirements available in regions of dense interconnect prevent use of wide conductors.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend partially parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. Each conductor is designed to carry a certain amount of current, based on the desired design and application. As a conductor carries current, a migration of conductive material occurs from one part of the conductor to another. Migration of material i.e., electromigration, causes localized thinning of the conductor leading to a resistance increase. The useful lifetime of a conductor thereby decreases with decreasing conductor thickness or decreasing conductor width.

Electromigratin causes a reliability issue. Design results are used to calculate a minimum width of the conductor based upon current requirement through the conductor. In order to maintain relatively small conductor widths (i.e., to maintain a small die size), it would be desirable to derive a technique for reworking a conductor to enhance its current-carrying capability. The importance of rework is particularly acute if rework can be selectively performed on certain conductors but not all conductors within a die. Thus, in many design layouts, there may exist conductors which have less than a minimum specified width to pass electromigration specification. The normal procedures for increasing width of the conductor are to move neighboring conductors to allow for increase in conductor width, increase die size to allow for increase in conductor width, or jeopardize minimum conductor spacing adjacent to the widened conductor. These re-work scenarios are intolerable in most instances.

Conductors are made from an electrically conductive material, a suitable material includes Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and dielectrically spaced above an underlying conductor or substrate. Each conductor is dielectrically spaced from other conductors within the same level of conductors (i.e., substantially coplanar conductors) by a defined lateral distance.

If a conductor cannot carry sufficient current for a desired application, the conductor is generally reconfigured in a manner involving a circuit revision or "design fix". In order to carry larger amounts of current, the reconfigured conductor can be made wider (i.e., wider in a lateral direction parallel to the semiconductor topography) than the other conductors. A negative consequence of widening a conductor is the encroachment of that conductor toward laterally spaced (neighboring) conductors. If adjacent conductors were originally configured a minimum space apart, one conductor cannot be made wider if the minimum spacing is violated. Thus, widening a conductor typically requires moving minimum-spaced, adjacent conductors away from the widened conductor. This reconfiguration may in certain instances be extremely burdensome and may impact the placement of numerous conductors arranged across the semiconductor die.

It would thereby be desirable to derive a technique for reworking a conductor to enhance its current-carrying capacity without having to reconfigure or move any other conductor arranged adjacent the enhanced conductor. The enhanced conductor must be one which can be readily reworked with minimal impact upon photolithography steps used in forming that conductor (or any other conductor upon the die). A technique must therefore be derived which can reconfigure select conductors in densely spaced areas without having to modify laterally adjacent conductors. This technique would be advantageous in circuit rework operations and would reduce the time required to produce circuit revisions. Enhancing a conductor's current-carrying capability without jeopardizing minimum conductor spacing would not only achieve current drive specifications but would do so without sacrificing propagation delay or cross-coupling noise.

SUMMARY OF THE INVENTION

The problems outlined above are in large part solved by modifying a conductor to enhance its current-carrying capability. The enhanced conductor is one having a larger cross-sectional area or, more specifically, is one which is thicker rather than wider.

The enhanced conductor is one that is thicker than many other conductors within a semiconductor die, and is certainly thicker than the metal layer which forms all other conductors within an interconnect level. A thicker conductor provides an overall conductor layout which does not violate minimum spacing rules. The larger cross-sectional area affords a greater current-carrying capacity. Also, the increase in cross-sectional area may be performed with material which is less susceptible to electromigration.

The rework technique hereof involves determining conductors which have insufficient current-carrying potential. Those conductors may then be reconfigured such that their thickness is increased rather than their width.

The present invention contemplates a plurality of conductors. The conductors comprises a pair of conductors, each having an upper surface and a lower surface. A first conductor is spaced partially between a pair of conductors. The first conductor includes a first upper surface and a first lower surface. The first upper surface is essentially coplanar with the upper surface of the pair of conductors. The first lower surface, however, is configured below the lower surface of the pair of conductors. The distance by which the first lower surface is below the lower surface of the pair of conductors is defined by a dielectric thickness of a two dielectric interlevel dielectric structure.

The present invention further contemplates a multilevel interconnect structure. The interconnect structure comprises a pair of conductors arranged on a first plane, defined herein as an elevational plane. The interconnect structure further comprises a first conductor having an upper portion and a lower portion. The upper portion of the first conductor is arranged on the first plane a spaced distance between the pair of conductors. The lower portion of the first conductor is arranged exclusively in a region directly below the upper portion of the first conductor.

The present invention yet further contemplates a method for forming a multilevel interconnect structure. The method comprises providing a semiconductor topography and then depositing a dielectric upon that topography. Portions of the dielectric are removed to the semiconductor topography to form at least one trench spaced from at least one via. A plug material is then deposited across the dielectric and into the trench and via. The plug material is removed from the upper surface of the dielectric to form a lower portion of the first conductor within the trench and a contact within the via. A conductive material is then deposited across the upper surface of the dielectric. The conductive material is then selectively removed in all regions except in regions directly above the lower portion and the contact. The conductive material remaining after it is selectively removed comprises an upper portion of a first conductor spaced between a pair of conductors.

BRIEF DESCRIPTION OF THE DRAWINGS

Other objects and advantages of the invention will become apparent upon reading the following detailed description and upon reference to the accompanying drawings in which.

Figure 1:
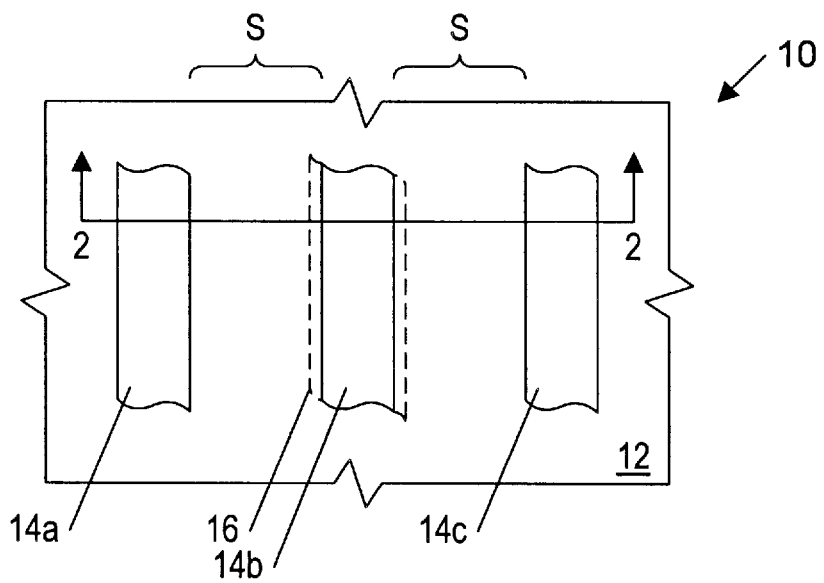
FIG. 1 is a partial, top plan view of a multilevel interconnect structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a partial, top plan view of a multilevel interconnect structure 10. Structure 10 includes a topological surface 12 upon which a plurality of conductors 14 are spaced. For sake of brevity, only three conductors of the plurality of conductors are shown. It is understood, however, that more than three conductors are patterned upon topological surface 12. Conductors 14 include a first conductor 14b laterally spaced between a pair of conductors 14a and 14c. Conductors 14 include any substantially conductive material, and topological surface 12 includes any insulated surface upon which conductors 14 can adhere.

If it is determined that first conductor 14b be reconfigured to handle a greater amount of current, then it can be advantageously reconfigured to handle that current. The first conductor 14b is enhanced not by increasing its lateral dimension, as shown by reference numeral 16. If conductor 14b is enhanced to the geometry shown at 16, then minimum spacing S will be jeopardized causing a potential shorting problem. Accordingly, increases in current-carrying capacity take place by increasing the thickness of first conductor 14b rather than its width. Increase in thickness is better illustrated in reference to FIG. 2.

Figure 2:
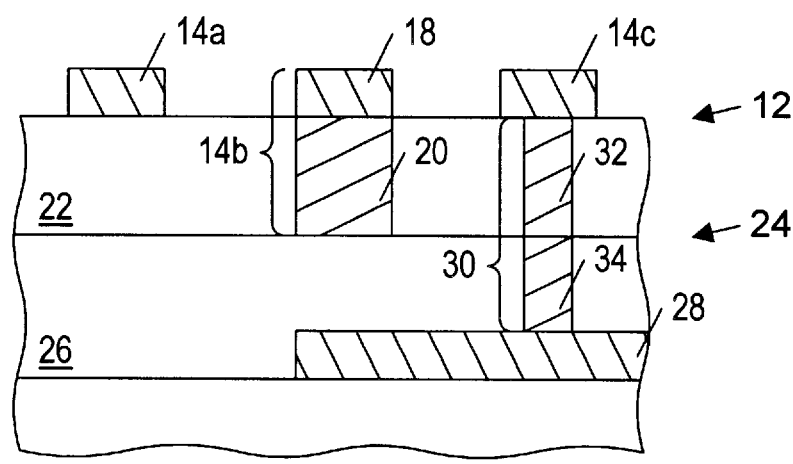
FIG. 2 is a cross-sectional view along plane 2 of FIG. 1.

Referring to FIG. 2, a cross-sectional view along plane 2 of FIG. 1 is shown. In particular, FIG. 2 illustrates conductors 14 patterned across topological surface 12, and the relative thickness of each conductor. Enhancements to current-carrying capacity are achieved by increasing the thickness of first conductor 14b. As shown, increase in thickness does not cause a reduction in spacing between conductors and, accordingly, enhancements to thickness provides a better rework methodology than enhancements to width. First conductor 14b is shown partially formed within topological surface 12. More specifically, conductor 14b includes an upper portion 18 and a lower portion 20. Upper portion 18 is substantially the same thickness, and is substantially coplanar with conductors 14a and 14c. Lower portion 20 is constrained entirely within a second dielectric 22. Lower portion 20 thereby extends from upper surface 12 to lower surface 24 of second dielectric 22. Lower portion 20 can be of different width than upper portion 18, if desired.

Second dielectric 22 is deposited upon first dielectric 26, wherein first dielectric 26 and second dielectric 22 comprise an inter-level dielectric structure interposed between a substantially coplanar set of conductors 28 and substantially coplanar set of conductors 14a and 14b. If one or more conductors 28 are to be connected to one or more conductors 14, then a contact structure 30 exists. Contact structure 30 includes an upper portion 32 and a lower portion 34.

Figure 3:
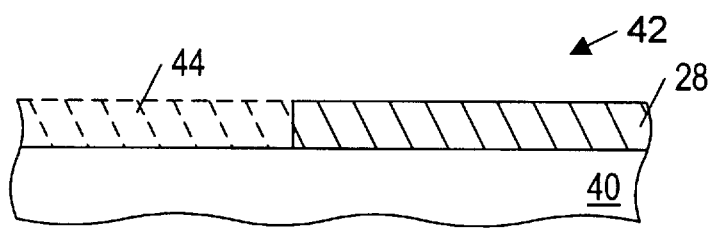
FIG. 3 is a cross-sectional view of a semiconductor topography along plane 2 showing formation of one or more first conductors (interconnect) formed upon the semiconductor topography.

Turning now to FIGS. 3–10, a processing sequence used in forming interconnect structure 10 is shown. FIG. 3 illustrates an initial sequence of steps in which a semiconductor substrate 40 is provided. Substrate 40 includes a conductive material upon which an insulative material is formed. The conductive material can be, according to one embodiment, electrically active dopants or separately deposited conductive material. Once substrate 40 is provided having an upper surface, a conductive material 42 is deposited upon that surface, as shown. The conductive material 42 suitably includes a refractory metal, such as tungsten or aluminum. Preferably, conductive material 42 is blanket deposited across the entire substrate 40. Thereafter, portions of conductive material are removed, as shown by dashed lines 44, to produce a set of conductors 28. Conductive material 42 can be deposited using any suitable technique, an exemplary technique being sputter deposition or chemical-vapor deposition. Portions of conductive material 42 are removed, preferably by a lithography sequence.

Figure 4:
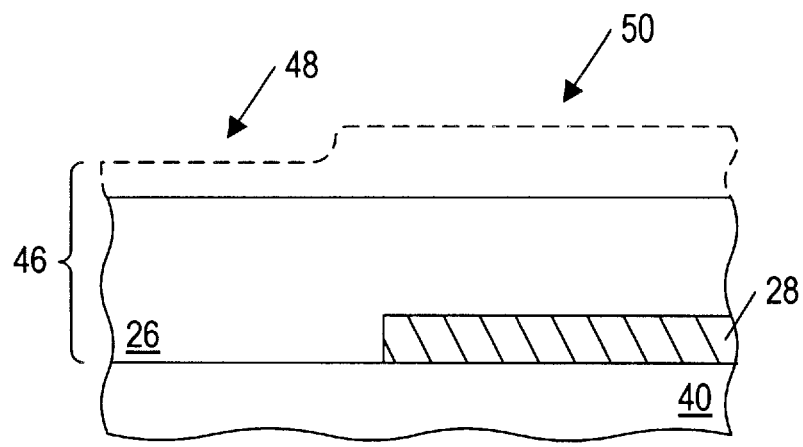
FIG. 4 is a cross-sectional view of a processing step subsequent to that shown in FIG. 3, wherein a first layer of dielectric is formed upon the first interconnect.

FIG. 4 depicts deposition of a first dielectric material 46 upon and between first set of conductors 28. In regions between conductors 28, a recess 48 will form, and upon first conductors 28 a hill 50 will form. If desired, and depending upon a needed amount of planarity, the upper surfaces may be selectively polished or etched (through block masking or sacrificial removal). Planarization removes the elevational disparities between recess 48 and hill 50 to produce a substantially planar upper surface 52. Upper surface 52 comprises the upper surface of resulting first dielectric 26. It is important to note, however, that depending upon the degree of elevational disparity, planarization may not be required. If planarization is not needed, then the interim steps of polishing and/or etching is unnecessary.

Figure 5:
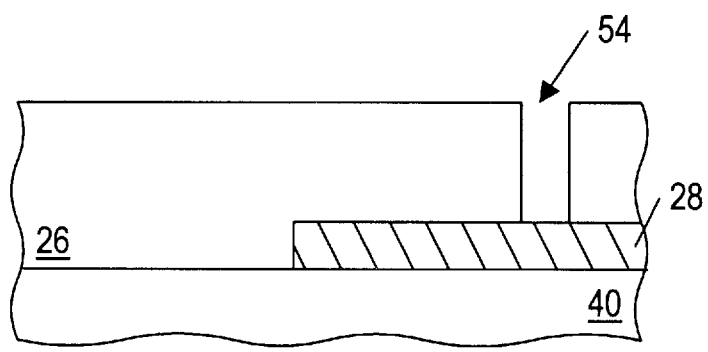
FIG. 5 is a cross-sectional view of a processing step subsequent to that shown in FIG. 4, wherein a first dielectric via is formed within the first layer of dielectric to the first interconnect.
Figure 6:
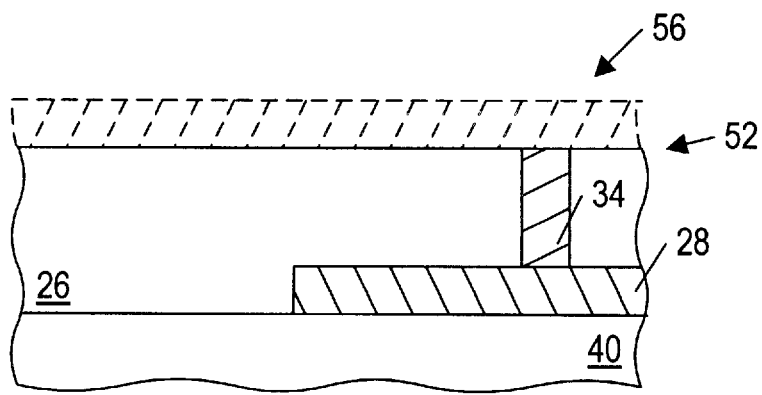
FIG. 6 is a cross-sectional view of a processing step subsequent to that shown in FIG. 5, wherein a first dielectric contact is formed within the first dielectric via.

FIG. 5 illustrates removal of first dielectric 26 in a select region directly above conductor 28. Select removal is achieved through selective masking to produce an opening or via 54 to the upper surface of conductor 28. FIG. 6 illustrates a subsequent step in which via 54 is filled by a conductive material 56. The geometry of via 54 is thereby chosen to allow complete fill of conductive material 56. Geometry of via 54 is thereby chosen as having a width-to-height ("aspect") ratio necessary to allow a chemical vapor deposited conductive material, such as tungsten, to completely fill via 54 above upper surface 52. Conductive material 56 is removed from the upper surface 52 of first dielectric 26 using various techniques, such as, for example, chemical-mechanical polishing. Removal of conductive material 56 to an elevational level substantially equal to or slightly below upper surface 52 produces lower portion 34 of contact 30, shown in FIGS. 2 and 6. The geometry of lower portion 34 is varied depending upon the size of via 54, and the size of via 54 is varied depending upon the overall thickness of first dielectric 26 and the available lateral space to which lower portion 34 electrically contacts.

Figure 7:
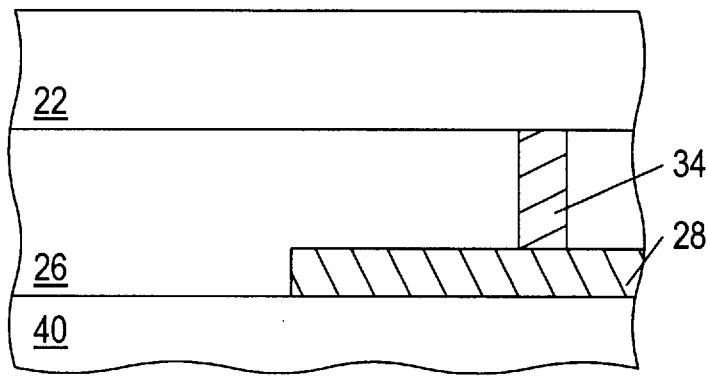
FIG. 7 is a cross-sectional view of a processing step subsequent to that shown in FIG. 6, wherein a second layer of dielectric is formed upon the first dielectric contact and upon the first layer of dielectric.

FIG. 7 illustrates deposition of a second dielectric material necessary to form second dielectric 22 upon first dielectric 26. Since all of conductive material 56 is removed from first dielectric 26 surface 52 in a preceding step, second dielectric 22 is deposited directly upon first dielectric 26 using, for example, chemical-vapor deposition or spin-on techniques.

Figure 8:
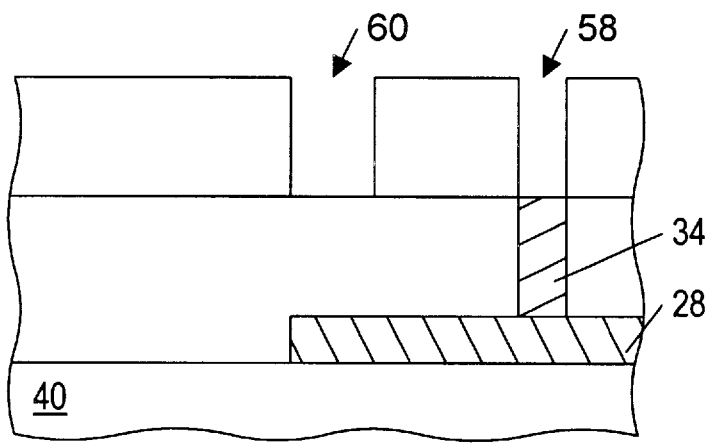
FIG. 8 is a cross-sectional view of a processing step subsequent to that shown in FIG. 7, wherein openings of varying sizes (i.e., trenches and second dielectric via) are formed within the second layer of dielectric.

FIG. 8 illustrates selective removal of second dielectric 22. The removed regions, or openings, are depicted as via 58 and trench 60. The depth of via 58 and trench 60 is substantially equal to the thickness of second dielectric 22. The cross-sectional base area of via 58 is substantially equal to the cross-sectional base area of lower portion 34. More importantly, via 58 aligns directly above lower portion 34, wherein via 58 is formed, e.g., by a timed etch. The base area of trench 60 is substantially equal to the base area of a subsequently placed first conductor 14b. Also, trench 60 is placed directly below an area upon which upper portion 18 of first conductor 14b is placed.

Figure 9:
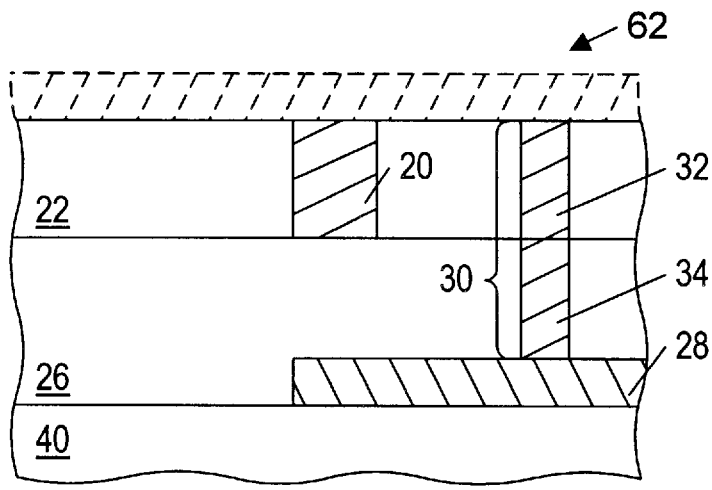
FIG. 9 is a cross-sectional view of a processing step subsequent to that shown in FIG. 8, wherein a second dielectric contact is formed within the second dielectric via and a portion of a second conductor is formed within the trench.

FIG. 9 illustrates deposition of yet another conductive material, suitably comprising tungsten, as depicted by reference numeral 62. Conductive material 62 is thereafter removed from the upper surface of second dielectric 22, leaving upper portion 32 of contact 30 and lower portion 20 of first conductor 14b. Conductive material 62 is suitably deposited by chemical-vapor deposition, and suitably removed by chemical-mechanical polishing. The temperature and atmospheric conditions in which conductive material 62 (as well as conductive material 56) is deposited varies depending upon the flow conditions and the amount of fill required. The deposition parameters are chosen so as to fill vias and trenches formed within a dielectric of moderate thickness. For example, tungsten has been shown to fill a via or trench between 0.2–2.0 microns wide for a deposition thickness slightly higher than half the width.

Figure 10:
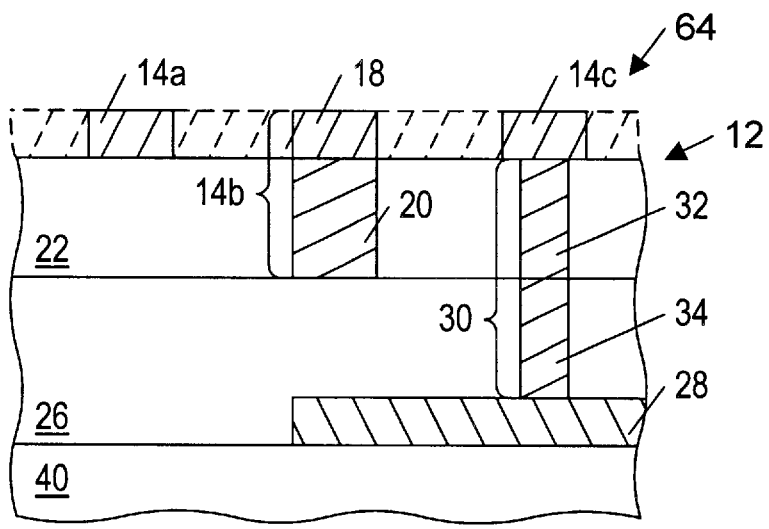
FIG. 10 is a cross-sectional view of a processing step subsequent to that shown in FIG. 9, wherein a remaining portion of the second conductor is formed.

After conductive material 62 is removed (as shown in FIG. 9), an upper dielectric surface 12 is presented upon which another layer of conductive material 64 is deposited as illustrated in FIG. 10. In this instance, conductive material 64 is deposited across the entire topological surface 12, and subsequently removed in select regions to present conductors 14a and 14c, as well as the upper portion 18 of conductor 14b. Upper portion 18 is in direct alignment above lower portion 20, and conductor 14c is in direct alignment above contact structure 30. In another instance, conductive material 64 can be patterned to produce all three conductors 14a, 14b and 14c. Producing three conductors is achieved by limiting conductive material 64 to aluminum deposited by an improved trench and via filling capability.

Lower portion 20 is advantageously produced to enhance the current-carrying capability of conductor 14b without requiring lateral encroachment of that conductor toward conductors 14a and 14c. Thus, conductor 14b can be geometrically enhanced while maintaining line-to-line minimum spacing. The thickness of first dielectric 26 ensures sufficient line-to-underlying line spacing, and the thickness of second dielectric 22 ensures sufficient enhancement to conductor 14b's thickness. Advantageously, second dielectric 22 is etched for a time sufficient to detect conductive material byproduct. Thus, lower portion 34 of conductor 30 serves as an etch stop for the formation of vias 58—as well as trenches 60 (shown in FIG. 8). A timed etch process may also be used to produce vias 58. This also may be done with a timed etch process based on the thickness of dielectric 22.

It would be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A plurality of conductors, comprising:

a pair of conductors each having an upper surface and a lower surface;

a first conductor spaced partially between the pair of conductors, said first conductor having a first upper surface and a first lower surface, said first conductor comprising a first layer of conductive material and a second layer of conductive material, said second layer of conductive material being arranged collinear with said first layer of conductive material; and said first upper surface is substantially coplanar with said upper surface and said first lower surface is configured below said lower surface.

2. The plurality of conductors as recited in claim 1, wherein said pair of conductors and only a portion of said first conductor are patterned from a single layer of conductive material.

3. The plurality of conductors as recited in claim 1, wherein said first conductor comprises a first layer of conductive material and a second layer of conductive material, and wherein the second layer of conductive material is configured upon the first layer of conductive material.

4. The plurality of conductors as recited in claim 3, wherein the first layer of conductive material comprises tungsten and said second layer of conductive material comprises aluminum.

5. The plurality of conductors as recited in claim 3, wherein the second layer of conductive material is formed of the same material and at the same time as the pair of conductors.

6. The plurality of conductors as recited in claim 3, wherein the second layer of conductive material and the pair of conductors are of approximately the same thickness.

7. A multilevel interconnect structure, comprising:

a pair of conductors arranged on a first plane; and a first conductor having a lower portion comprising a first layer of conductive material and an upper portion comprising a second layer of conductive material, wherein the upper portion is arranged on the first plane a spaced distance between the pair of conductors, and wherein the lower portion is arranged exclusively in a region directly below the upper portion.

8. The multilevel interconnect structure as recited in claim 7, wherein the pair of conductors and the upper portion are lithography formed from a single layer of aluminum material.

9. The multilevel interconnect structure as recited in claim 7, wherein the lower portion is formed by a process comprising removing a region within a dielectric and filling the region with a conductive material.

10. The multilevel interconnect structure as recited in claim 7, wherein the pair of conductors and said upper portion are formed by a process comprising depositing a conductive material upon a dielectric and removing portions of said conductive material between said pair of conductors and said upper portion.

11. The multilevel interconnect structure as recited in claim 7, wherein said first conductor extends from a plane beneath the first plane to a plane above the first plane.

12. A plurality of conductors, comprising:

a pair of conductors each having an upper surface and a lower surface;

a first conductor spaced partially between the pair of conductors, said first conductor having a first upper surface and a first lower surface, said first conductor comprising a layer of tungsten and a layer of aluminum, said layer of tungsten being arranged upon and collinear with said layer of aluminum; and said first upper surface is substantially coplanar with said upper surface and said first lower surface is configured below said lower surface.

* * * * *